United States Patent
Li et al.

(10) Patent No.: US 9,667,191 B2
(45) Date of Patent: May 30, 2017

(54) ULTRASOUND LENS CLEANER DRIVER WITH FREQUENCY SELECTABLE OSCILLATOR

(71) Applicant: Texas Instruments Incorporated, Dallas, TX (US)

(72) Inventors: Yunhong Li, Santa Clara, CA (US); Wei Ma, San Ramon, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 100 days.

(21) Appl. No.: 14/799,309

(22) Filed: Jul. 14, 2015

(65) Prior Publication Data

US 2017/0019065 A1   Jan. 19, 2017

(51) Int. Cl.
*H03B 5/12* (2006.01)
*H04N 5/225* (2006.01)
*G02B 27/00* (2006.01)

(52) U.S. Cl.
CPC ....... *H03B 5/1203* (2013.01); *G02B 27/0006* (2013.01); *H04N 5/2254* (2013.01)

(58) Field of Classification Search
CPC ............ H03B 5/1203; H04N 5/2254; H04N 1/00909; G02B 27/0006; B60S 1/0848
See application file for complete search history.

(56) References Cited

U.S. PATENT DOCUMENTS

| | | | |
|---|---|---|---|
| 3,989,042 A | 11/1976 | Mitsui et al. | |
| 2012/0243093 A1* | 9/2012 | Tonar | G02B 27/0006 359/507 |
| 2012/0306563 A1* | 12/2012 | Fujikawa | H03K 17/04123 327/434 |
| 2014/0125422 A1* | 5/2014 | Koyama | H03B 5/362 331/116 R |
| 2016/0248462 A1* | 8/2016 | Danilenko | H04B 1/12 |

* cited by examiner

*Primary Examiner* — Jason Flohre
(74) *Attorney, Agent, or Firm* — John R. Pessetto; Charles A. Brill; Frank D. Cimino

(57) ABSTRACT

A frequency selectable driver circuit (driver circuit) includes a current drive transistor between a first and second node for driving a frequency selectable oscillator (FSO) coupled therebetween that includes a first LC network including an inductor L2 and a capacitor C2 in series and a second LC network in series with the first LC network. The second LC network includes a capacitor bank including capacitors in parallel including switches for switching (selectable capacitors) and an inductor L3 in parallel to the capacitor bank. Values of L2 and C2 provide a low frequency point $f_L$ which the LC network is overall capacitive, and in a frequency range between $f_a$ and $f_b$ above $f_L$ with only a portion of selectable capacitors selected a capacitance of the capacitor bank and value of L3 results in an overall impedance for the second LC network that is capacitive between $f_a$ and $f_b$ and inductive elsewhere.

15 Claims, 6 Drawing Sheets ced for the second LC network. The second LC network includes a capacitor bank including capacitors in parallel including series switches for switching (selectable capacitors) and an inductor L3 in parallel to the capacitor bank. Values of L2 and C2 provide a low frequency point $f_L$ below which the overall impedance of the first and second LC network is capacitive, and wherein in a frequency range between $f_a$ and $f_b$ and above $f_L$ with only a portion of selectable capacitors selected a capacitance of the capacitor bank and value of L3 sets the overall impedance capacitive between $f_a$ and $f_b$ and inductive elsewhere.

BRIEF DESCRIPTION OF THE DRAWINGS

Reference will now be made to the accompanying drawings, which are not necessarily drawn to scale, wherein.

DETAILED DESCRIPTION

Figure 1:
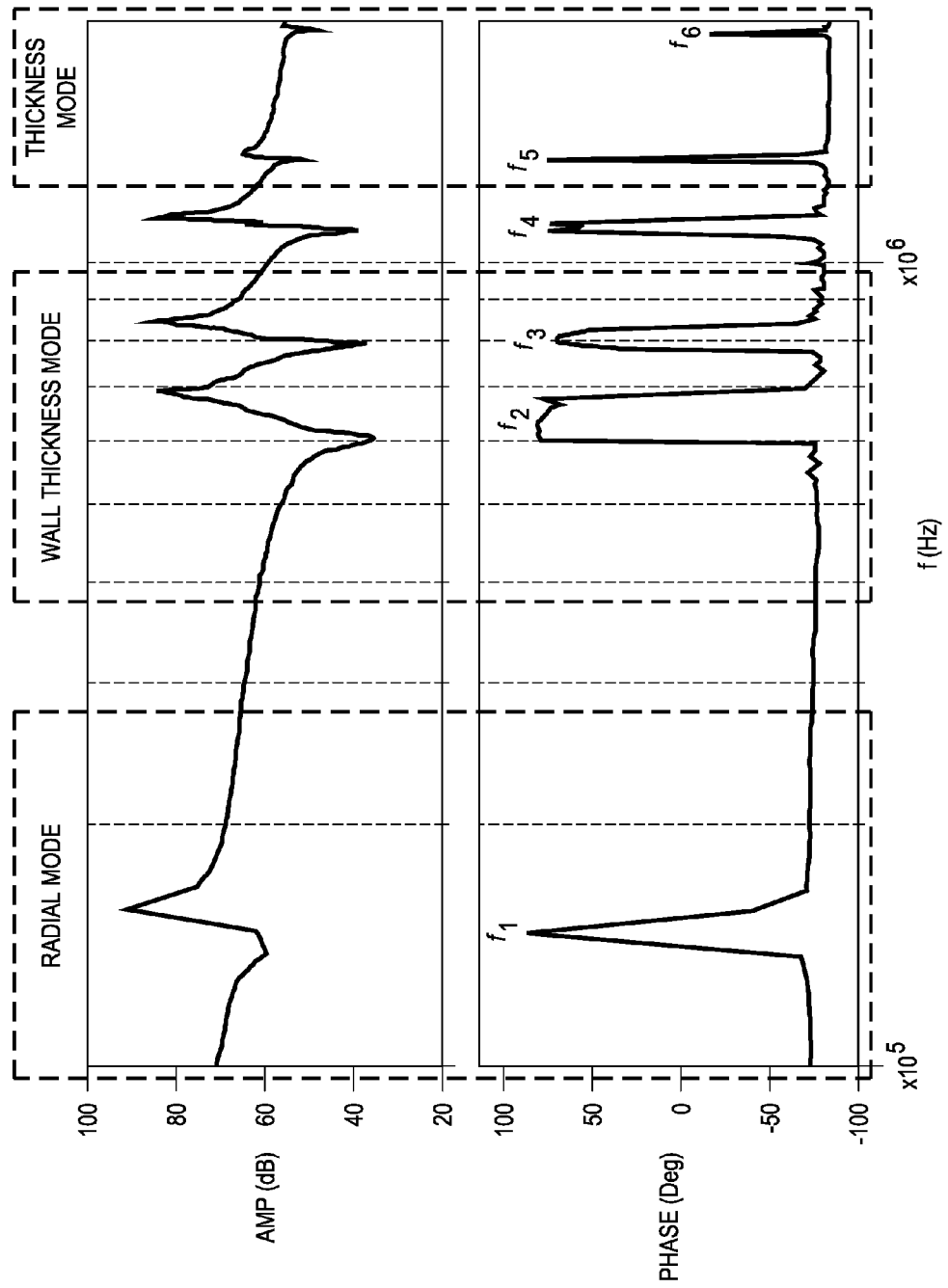
FIG. 1 shows a ring transducer typically having six resonating points, according to an example embodiment.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

Also, the terms "coupled to" or "couples with" (and the like) as used herein without further qualification are intended to describe either an indirect or direct electrical connection. Thus, if a first device "couples" to a second device, that connection can be through a direct electrical connection where there are only parasitics in the pathway, or through an indirect electrical connection via intervening items including other devices and connections. For indirect coupling, the intervening item generally does not modify the information of a signal but may adjust its current level, voltage level, and/or power level.

Disclosed embodiments recognize for lens cleaning applications for cameras, such as for backup cameras (or reversing cameras) for automobiles, the piezoelectric transducer (transducer) should have an aperture so that light can be transmitted through to the photodetector array, such as provided by a center aperture of a ring transducer. However, due to the presence of the aperture a ring transducer (or other transducer having an aperture) has complex vibration modes with associated resonant frequencies generally distributed from a few KHz up to a few MHz range (see FIG. 1 described below). To achieve effective lens cleaning results, it is recognized that switching among the multiple vibration modes of the transducer is generally needed. A self-oscillating circuit for driving the electrodes of a ring transducer generally needs to cover the wide frequency range needed for ultrasonic lens cleaning. For example, a ring transducer is recognized to have three different resonant modes each providing a different resonant frequency (f):

Radial (r) Mode:

$$f_r = \frac{2}{\pi(D1+D2)\sqrt{\rho s_{11}^E}}$$

Wall Thickness (w) Mode:

$$f_w = \frac{1}{(D2-D1)\sqrt{\rho s_{11}^E}}$$

Thickness (t) Mode:

$$f_t = \frac{1}{2T\sqrt{\rho s_{33}^D}}$$

where D1 is the inner ring diameter, D2 is the outer ring diameter, T is the thickness of the ring, $\rho$ is the density of the transducer material, and $s_{11}^E$ and $s_{33}^D$ are elastic compliances at constant electric field and constant charge density, respectively. For example, for a lead zirconate titanate (PZT) ring transducer 18 mm (outer diameter D2)×12 mm (inner diameter D1)×1.2 (thickness T) in size the resonant frequencies measured were found to be 63 kHz for the radial mode, 508 kHz for the wall thickness mode and 1,810 kHz for the thickness mode. These resonant frequencies together with their higher order harmonics can be closely spaced in the frequency domain as shown in FIG. 1 which shows 6 resonating points (peaks) associated with the radial, wall thickness and thickness modes of a ring transducer labelled $f_1$ (lowest frequency) to $f_6$ (highest frequency). A ring transducer thus has at least three resonant frequencies, from $f_1$ to $f_n$. The peak amplitudes (Amp, in dB) for $f_1$ to $f_6$ correspond to the frequencies at which the phase is about 90 degrees, and at these frequencies the transducer vibrates most intensely.

Figure 2:
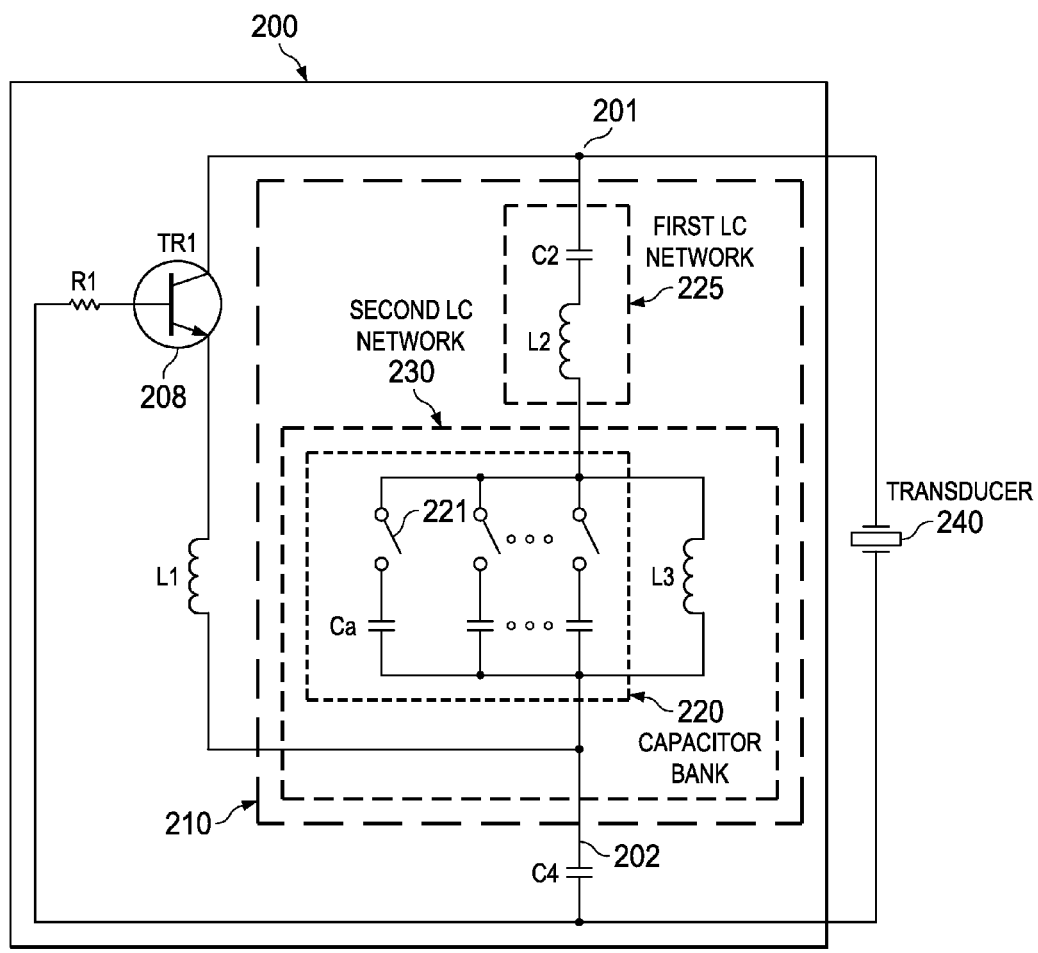
FIG. 2 shown an example frequency selectable driver circuit (driver circuit) including a capacitor bank for switching the transducer among multiple transducer vibration modes over a wide frequency range needed for effective ultrasonic lens cleaning, according to an example embodiment.

FIG. 2 shown an example frequency selectable driver circuit (driver circuit) 200 including a capacitor bank 220 coupled to electrodes of a piezoelectric transducer (transducer) 240 for switching the transducer among multiple vibration modes over a wide frequency range utilized for effective ultrasonic lens cleaning, according to an example embodiment. Driver circuit 200 includes a current drive transistor 208 that is generally a bipolar transistor due to its current drive capability although certain MOS transistors may also be possible, coupled between a first node 201 and a second node 202 for driving a frequency selectable oscillator (FSO) 210 coupled between the first node and second node that is coupled to electrodes of the transducer 240 to drive the transducer 240. The transducer 240 can be in various shapes such as disc, ring, barrel, or a portion of these shapes such as half-disc, half-ring, and half-barrel.

The FSO 210 includes a first LC network 225 comprising an inductor L2 and a capacitor C2 in series as a series-resonant circuit, and a second LC network 230 as a parallel-resonant circuit, in series with the first LC network 225. The second LC network 230 includes the capacitor bank 220 shown including a plurality of capacitors in parallel to one another including series switches 221 with each capacitor for switching either implementing selecting (adding the capacitor to the total capacitance value Ca) or deselecting (removing the capacitor from Ca). In one arrangement the capacitors in the capacitor bank 150 have binary weighted capacitances.

The switches 221 can include a combination of selection and deselection to enable obtaining close to a desirable total capacitance value. The capacitor bank 220 generally provides a switch configurable capacitance range of at least one order of magnitude. Although all capacitors in the capacitor bank 220 are shown including switches 221, the capacitor bank 220 can be designed to provide a range of selections with switches 221 for selection of only part of the capacitors. Capacitors having switches 221 are referred to herein as selectable capacitors. An inductor L3 is in parallel to the capacitor bank 220. Switches 221 comprises MOS transistors in this example.

Figure 3:
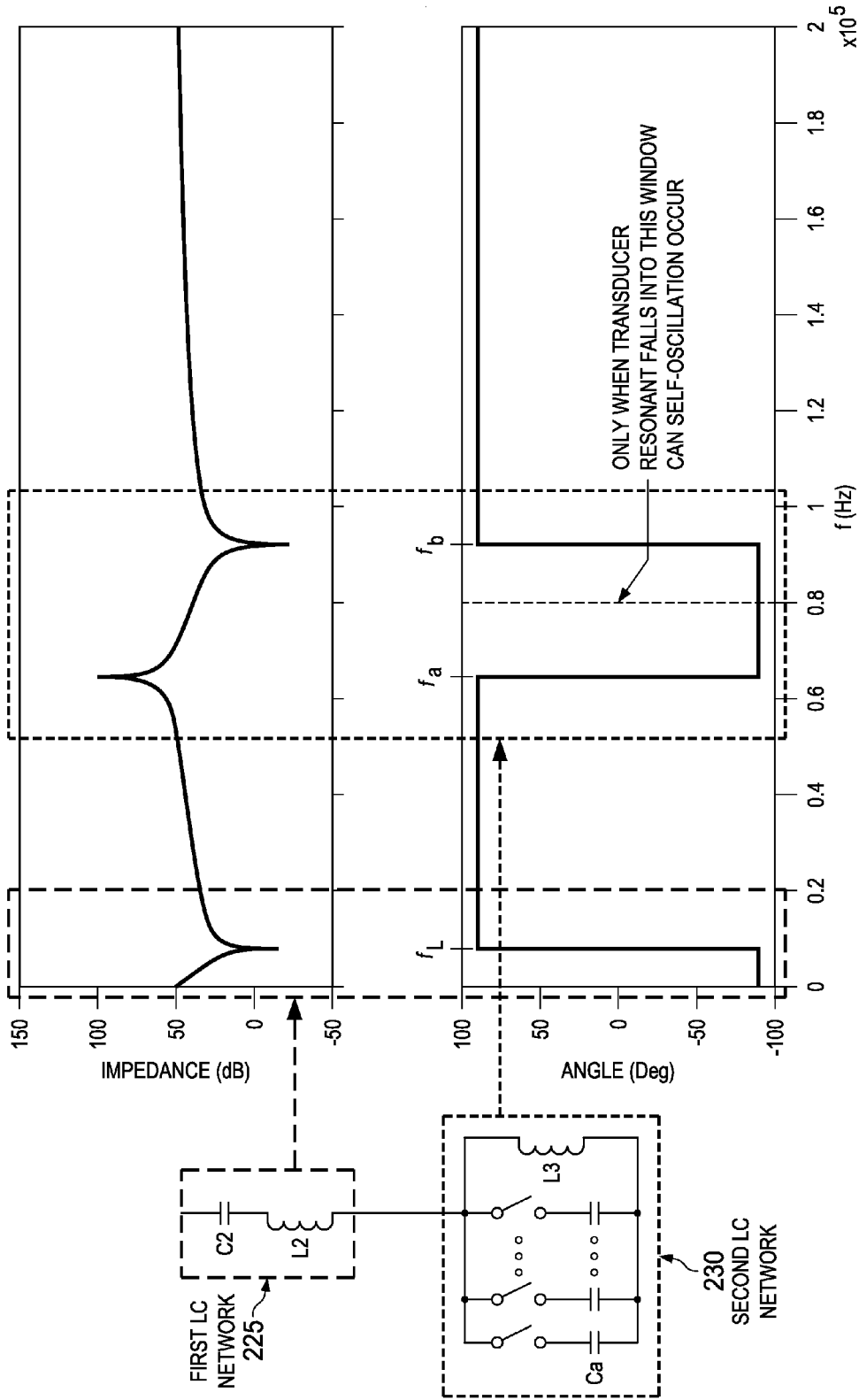
FIG. 3 shows a first LC network (first resonant circuit) comprising an inductor and a capacitor in series and a second resonant circuit in series with the first resonant circuit and the resulting impedance and angle vs. frequency performance.

The values for L2 (e.g., 200 µH) and C2 (e.g., 1 nF) are generally selected to provide a low frequency point $f_L$ that below which the overall impedance of the first LC network 225 and the second LC network 230 is capacitive (phase angle negative 90 degrees). Also, in a frequency range between $f_a$ and $f_b$ that is above $f_L$ with only a portion of the selectable capacitors selected in the capacitor bank 220, a value of capacitance of the capacitor bank 220 (shown and referred to herein as Ca) together with a value of L3 results in the overall impedance of the first LC network 225 and second LC network 230 that is capacitive between $f_a$ and $f_b$ and inductive (phase angle positive 90 degrees) elsewhere. It is noted a capacitive load has phase angle of negative 90 degree, and inductive load has angle of positive 90 degree. FIG. 3 shows the overall impedance of LC network 225 and LC network 230. The value of $f_L$ is mostly determined by tuning LC network 225. The values of fa and fb are mostly determined by the tuning LC network 230.

FIG. 3 shows the first LC network 225 comprising an inductor L2 and a capacitor C2 in series and a second LC network 230 in series with the first LC network 225 and the resulting impedance and phase angle (in degrees) vs. frequency performance for L2=200 µH, C2=1 nF and L3=200 µH. Only when the transducer's resonant frequency falls into the window shown between $f_a$ and $f_b$ where self-oscillation can occur. As described above, by setting values of L2, C2 to establish a low frequency point ($f_L$), below which this part of the driver circuit appears as a capacitor, and at frequency above $f_L$, by selecting certain of the plurality capacitors in the capacitor bank 220, the impedance can be controlled to make it capacitive between $f_a$ and $f_b$, but inductive elsewhere.

Figure 4:
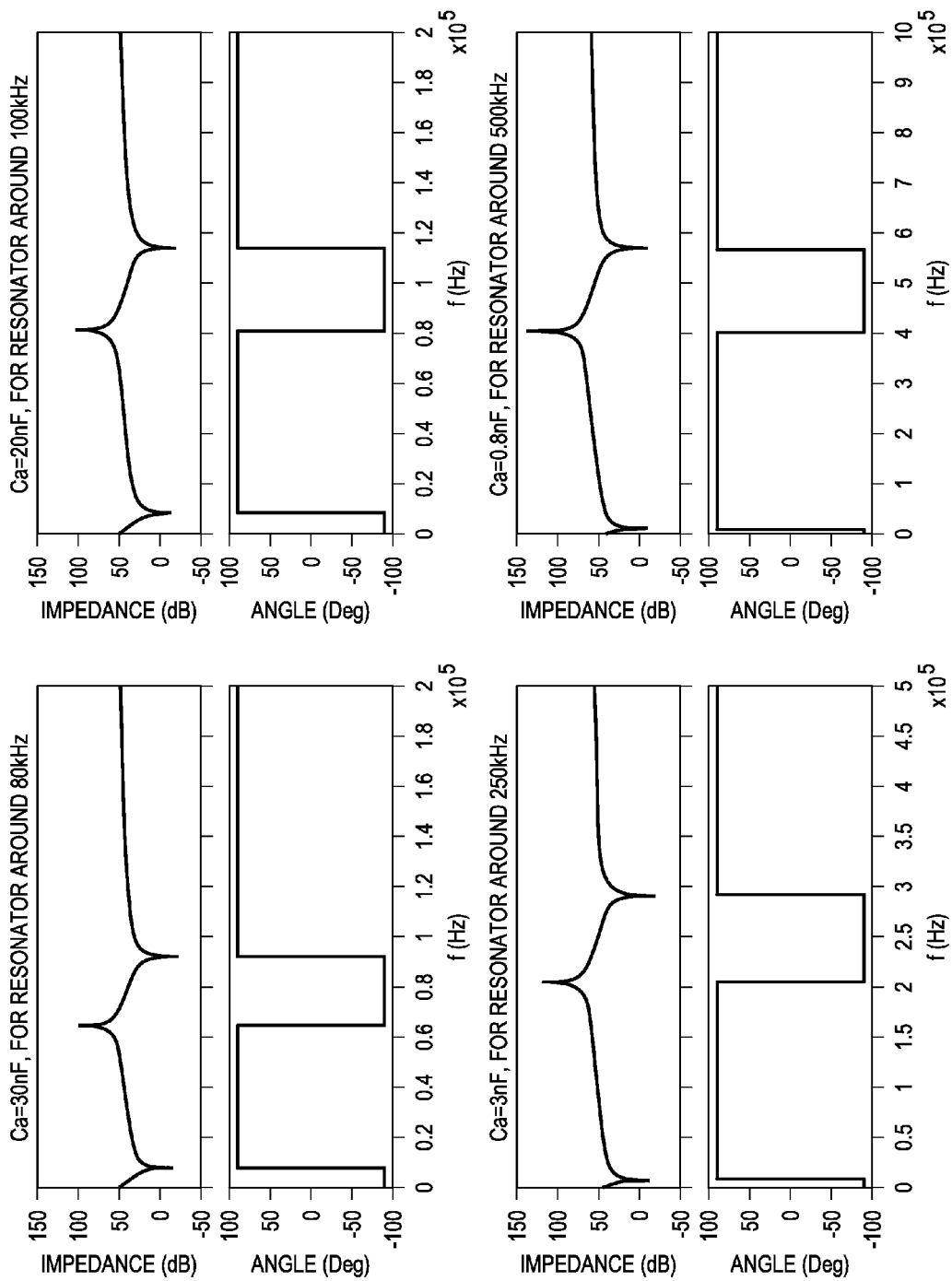
FIG. 4 shows the impedance and angle vs. frequency performance for a disclosed capacitor bank that provides an electronically configurable capacitive range from 0.8 nF to 30 nF to match different resonances of a piezoelectric transducer.

FIG. 4 shows the impedance and angle vs. frequency performance for a disclosed capacitor bank that provides a switch configurable capacitance range from 0.8 nF to 30 nF for matching the resonances of a ring transducer. As noted above Ca stands for the total capacitance of the capacitor bank, where as well-known in basic electronic circuits parallel capacitor connections result in additive capacitance values (Ca=C1+C2+C3 . . . ). Ca is shown=30 nF for a resonator around 80 kHz, Ca=30 nF for a resonator around 80 kHz, Ca=3 nF for a resonator around 250 kHz, and Ca=0.8 nF for a resonator around 500 kHz.

Denoting the resonant frequencies (f) of an example PZT ring transducer as the radial mode: $f\_PZT_a$, Wall-thickness mode: $f\_PZT_{WT}$ and Thickness mode: $f\_PZT_T$. Values of C2, L2 for the driver circuit can be set so that there is a frequency $f_L$, below which the impedance is capacitive and above which the impedance is inductive.

Let $f_L < \min(f\_PZT_a, f\_PZT_{WT}, f\_PZT_T)$, so that no self-oscillation can occur below $f_L$. Set L3 and Ca (total capacitance value of the capacitor bank) so that there is a frequency range defined by $f_a$ and $f_b$, where the impedance appears:

Inductive when $f < f_L$;
Capacitive when $f_a < f < f_b$, and
Inductive when $f > f_b$.

The self-oscillation can thus only occur when one of the transducer's resonant frequencies falls in-between $f_a$ and $f_b$. Hence by electronically changing Ca the oscillation frequency for a disclosed driver circuit 200 can be switched to match any of the transducer's resonant modes so that self-oscillation occurs.

Figure 5:
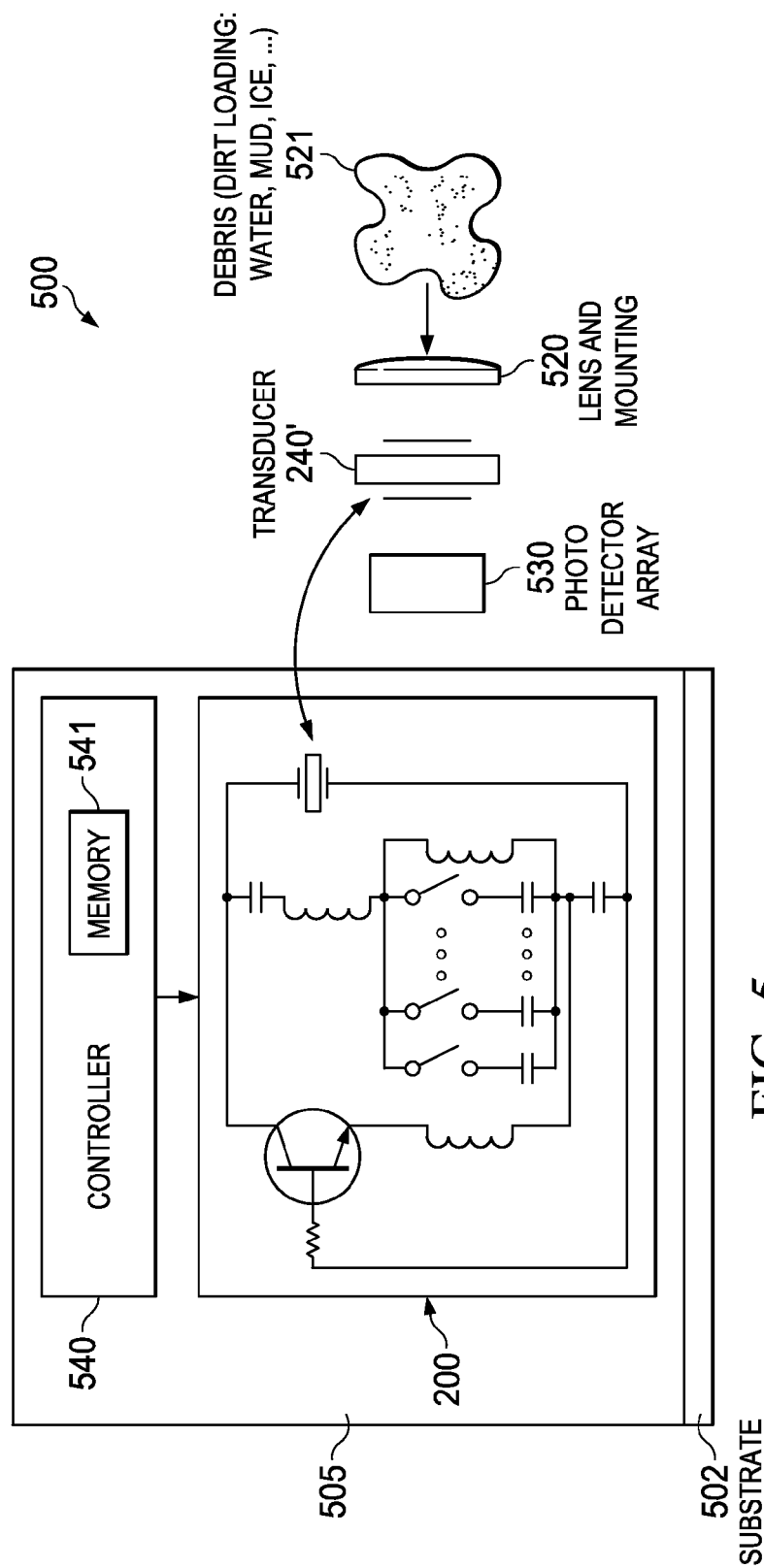
FIG. 5 shows an example camera system including an example integrated circuit (IC) combination including an IC comprising a controller having an associated memory storing a lens module and transducer combination resonant frequencies profile and cleaning pattern generator coupled to a disclosed frequency selectable driver circuit, ring transducer, and lens.

FIG. 5 shows an example camera system 500 including an example integrated circuit (IC) combination 505 on a substrate 502 having a semiconductor surface (e.g., silicon), according to an example embodiment. IC combination 505 includes a controller 540 having an associated memory 541 that stores a lens module and transducer combination resonant frequencies profile and cleaning pattern algorithm. The controller 540 is coupled to a disclosed driver circuit 200. The driver circuit 200 is a frequency selectable self-oscillating driver which is coupled to electrodes on the ring transducer 240' to drive the transducer. The transducer is mechanically coupled to the lens with a mounting structure (lens module) 520. The camera system 500 includes a photodetector array 530 positioned on the side of the transducer 240 opposite the lens module 520 for receiving light transmitted through the center aperture of the ring transducer 240'. Debris 521 is shown on the lens of the lens module 520.

IC combination 505 is designed to efficiently drive and resonate the ring transducer 240' at its multiple resonating frequencies when the ring transducer 240' is a complex transducer of various shapes such as ring or barrel-shaped. By including a controller 540 and a lens module and transducer combination resonant frequency profile and cleaning pattern algorithm stored in an associated memory 541, the driver circuit 200 acting as an oscillator can be switched by electronically switching one or more switches in the capacitor bank among the different resonant frequencies of the ring transducer 240', such as based on a pre-determined frequency scanning pattern, thus improving the lens cleaning performance.

Lens module 520 is mechanically coupled (e.g., attached to or embedded into lens) to ring transducer 240' to receive vibrational waves therefrom. Although the driver circuit 200 is shown on the same substrate 502 as the controller 540, the driver circuit 200 can be on a separate substrate (chip).

The controller 540 determines the cleaning pattern, including the order to excite the different resonant modes associated with the ring transducer 240', and each mode's strength (amplitude) and its length in time. For a certain lens module 520 and ring transducer 240' combination, the usable resonant frequencies profile can be unique. This custom profile for a particular set of resonant frequencies can be stored in memory 541 so that it is accessed by the controller 540 to adapt the driver circuit parameters to match the set of resonant frequencies.

The cleaning pattern utilized can be designed based on the type of debris 521 that may cover the lens, e.g. dirt, sand, salt, mud, water etc. to be cleaned, material for the lens, environmental conditions and power considerations. The type of debris materials to be cleaned from the lens can be determined by a feedback mechanism. For example the camera's image quality can be used as a feedback parameter (e.g., using known image processing techniques) to determine if the received image is clear or not. For a particular cleaning scenario, more than one vibration mode of the ring transducer 240' may be excited, where the controller 540 can use a pre-defined cleaning pattern to electronically cycle through different vibrational modes. A cleaning pattern can be obtained from learning based on cleaning results and the type of lens module used as different lens modules each will generally have its own cleaning pattern/parameters to address the differences in mechanical construction.

IC combination 505 can adaptively drive and resonate both simple and complex transducer systems with complex loading and mounting. When the ring transducer 240' is attached or embedded into the lens, lens cover or housing, this may change the resonant frequencies. When the lens, lens cover and housing are loaded by various debris 521 such as water, ice frost, mud, this may also change the resonant frequencies. Environmental induced changes such as weather, temperature, humidity, pressure, location and latitude may also vary the resonant frequencies. Resonant frequency changes can be adaptively accounted for by designing the values of fa and fb as described above so that the oscillation occurs in a range specified by fa and fb, which can be wide enough to account for variations introduced by above-mentioned factors.

Figure 6:
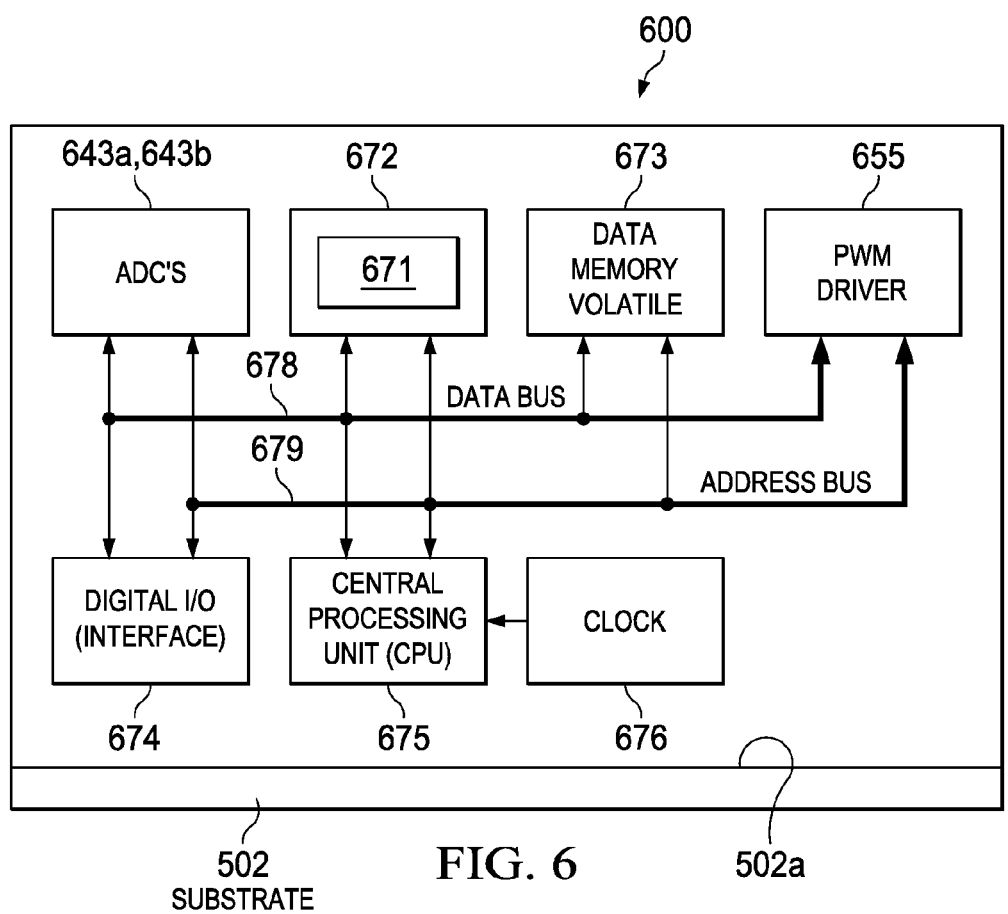
FIG. 6 is a block diagram depiction of a monolithic IC processor chip combination (IC combination) formed on a semiconductor surface of a substrate including a central processing unit, and a non-volatile memory that stores a lens module and transducer combination resonant frequencies profile and cleaning pattern algorithm, according to an example embodiment.

FIG. 6 is a block diagram depiction of a monolithic IC processor chip combination (IC combination) 600 formed on a semiconductor surface 502a of a substrate 502 including a central processing unit (CPU or processor) 675, and a non-volatile memory 672 (e.g., flash memory) that stores a lens module and transducer combination resonant frequencies profile and cleaning pattern algorithm 671, according to an example embodiment. The IC combination 600 can comprise a microprocessor, digital signal processor (DSP) or microcontroller unit (MCU).

Although not shown, the IC combination 600 may include other integrated circuit modules, for example, a Universal Serial Bus (USB) controller and a transceiver. IC combination 600 is shown including a volatile data memory 673, digital I/O (interface) 674, PWM driver 655, ADC's 643a, 643b, and clock (or timer) 676. IC processor chip combination 600 is also shown including a digital data bus 678 and an address bus 679.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure. For example, as an alternative to a capacitor bank with a fixed inductor it is possible to use an inductor bank with a fixed capacitor. However, a capacitor bank generally uses significantly less chip area and hence is generally more suitable for on-chip implementations.

The invention claimed is:

1. A frequency selectable driver circuit (driver circuit), comprising:
   a current drive transistor coupled between a first node and a second node for driving a frequency selectable oscillator (FSO) coupled between said first node and said second node, said FSO including:
   a first LC network comprising an inductor L2 and a capacitor C2 in series;
   a second LC network in series with said first LC network comprising:

a capacitor bank including a plurality of capacitors in parallel including series switches for switching at least a portion of said plurality of capacitors (selectable capacitors), and an inductor L3 in parallel to said capacitor bank;

wherein values of said L2 and said C2 provide a low frequency point ($f_L$) which said first LC network has an overall impedance that is capacitive, and wherein in a frequency range $f_a$ and $f_b$ above said $f_L$ with only a portion of said selectable capacitors selected in said capacitor bank, a value of capacitance of said capacitor bank and a value of said L3 results in an overall impedance of said second LC network that is capacitive between said $f_a$ and $f_b$ and inductive elsewhere.

2. The driver circuit of claim 1, wherein said second LC network comprises a parallel-resonant circuit.

3. The driver circuit of claim 1, wherein a portion of said plurality of capacitors do not include said series switch.

4. The driver circuit of claim 1, wherein said capacitor bank provides a switch configurable capacitance range of at least one order of magnitude.

5. The driver circuit of claim 1, further comprising a substrate having a semiconductor surface that said driver circuit is formed on.

6. The driver circuit of claim 1, wherein said current drive transistor comprises a bipolar transistor.

7. An integrated circuit (IC) combination, comprising:
a substrate having a semiconductor surface;
a processor on said semiconductor surface, and
a frequency selectable driver circuit (driver circuit) on said semiconductor surface comprising:
a current drive transistor coupled between a first node and a second node for driving a frequency selectable oscillator (FSO) coupled between said first node and said second node, said FSO including:
an first LC network comprising an inductor L2 and a capacitor C2 in series, and
a second LC network in series with said first LC network comprising:
a capacitor bank including a plurality of capacitors in parallel including series switches for switching at least a portion of said plurality of capacitors (selectable capacitors), and
an inductor L3 in parallel to said capacitor bank;
wherein values of said L2 and said C2 provide a low frequency point ($f_L$) which said first LC network has an overall impedance that is capacitive;
wherein in a frequency range $f_a$ and $f_b$ above said $f_L$ with only a portion of said selectable capacitors selected in said capacitor bank, a value of capacitance of said capacitor bank and a value of said L3 results in an overall impedance of said second LC network that is capacitive between said $f_a$ and $f_b$, and inductive elsewhere, and
wherein said processor is coupled to said series switches of said capacitor bank for switching said selectable capacitors.

8. The IC combination of claim 7, wherein said processor comprises a microcontroller unit (MCU).

9. The IC combination of claim 7, wherein said second LC network comprises a parallel-resonant circuit.

10. The IC combination of claim 7, wherein said capacitor bank provides a switch configurable capacitance range of at least one order of magnitude.

11. The IC combination of claim 7, further comprising a memory associated with said processor on said semiconductor surface, wherein a lens module and transducer combination resonant frequencies profile and cleaning pattern algorithm is stored in said memory which includes code for adaptively changing a first cleaning pattern using feedback from an image quality measurement from an image generated by a camera system using said first cleaning pattern.

12. A camera system, comprising:
an IC combination on a substrate having a semiconductor surface, comprising:
a controller having an associated memory that stores a lens module and transducer combination resonant frequencies profile and cleaning pattern algorithm;
a frequency selectable driver circuit (driver circuit) having an input coupled to an output of said controller;
said driver circuit comprising:
a current drive transistor coupled between a first node and a second node for driving a frequency selectable oscillator (FSO) coupled between said first node and said second node, said FSO including:
a first LC network comprising an inductor L2 and a capacitor C2 in series,
a second LC network in series with said first LC network comprising:
a capacitor bank including a plurality of capacitors in parallel including series switches for switching at least a portion of said plurality of capacitors (selectable capacitors), and
an inductor L3 in parallel to said capacitor bank;
wherein values of said L2 and said C2 provide a low frequency point ($f_L$) which said first LC network has an overall impedance that is capacitive, and
wherein in a frequency range $f_a$ and $f_b$ above said $f_L$ with only a portion of said selectable capacitors selected in said capacitor bank, a value of capacitance of said capacitor bank and a value of said L3 results in an overall impedance of said second LC network that is capacitive between said $f_a$ and $f_b$ inductive elsewhere;
a transducer having at least one aperture having electrodes coupled to be driven by said driver circuit;
a lens module mechanically coupled to said transducer, and
a photodetector array opposite said lens module positioned for receiving light transmitted through said aperture.

13. The camera system of claim 12 wherein said transducer comprises a ring transducer.

14. The camera system of claim 12, wherein said lens module and transducer combination resonant frequencies profile and cleaning pattern algorithm includes code for adaptively changing a first cleaning pattern using feedback from an image quality measurement from an image generated by said camera system using said first cleaning pattern.

15. The camera system of claim 12, wherein said capacitor bank provides a switch configurable capacitance range of at least one order of magnitude.

* * * * *